(12) United States Patent
Safavi et al.

(10) Patent No.: US 8,590,184 B2
(45) Date of Patent: Nov. 26, 2013

(54) DISPLAY DEVICE FOR TRANSPORTATION VEHICLE

(75) Inventors: Ramin Safavi, Plano, TX (US); Xiaoping Zhou, Plano, TX (US); Zhicun Gao, Plano, TX (US); Larry Taylor, Blue Ridge, TX (US)

(73) Assignee: Luminator Holding L.P., Plano, TX (US)

( * ) Notice: Subject to any disclaimer, the term of this patent is extended or adjusted under 35 U.S.C. 154(b) by 8 days.

(21) Appl. No.: 13/169,911

(22) Filed: Jun. 27, 2011

(65) Prior Publication Data

US 2012/0324771 A1    Dec. 27, 2012

(51) Int. Cl.
*G09F 13/00* (2006.01)

(52) U.S. Cl.
USPC .................................. 40/549; 52/38

(58) Field of Classification Search
USPC ............ 40/544, 564, 574, 549; 52/38, 653.1; 248/220.21; 361/747
See application file for complete search history.

(56) References Cited

U.S. PATENT DOCUMENTS

| | | | | |
|---|---|---|---|---|
| 3,538,634 A | * | 11/1970 | Bloom | 40/549 |
| 5,665,938 A | * | 9/1997 | Boshear et al. | 174/50 |
| 6,112,444 A | * | 9/2000 | Milliken et al. | 40/603 |
| 6,583,773 B1 | | 6/2003 | Nogami et al. | |
| 7,394,351 B2 | | 7/2008 | Solow | |
| 2005/0000126 A1 | | 1/2005 | Gray et al. | |
| 2005/0005487 A1 | * | 1/2005 | Gray et al. | 40/452 |

OTHER PUBLICATIONS

Patent Cooperation Treaty: International Search Report for Related Application PCT/US2011/050598; Apr. 18, 2012; Choi, Jinho; 3 pages.
Patent Cooperation Treaty: International Preliminary Report on Patentablility for Related Application PCT/US2011/050598; May 20, 2013; Junge, Kristina; 8 pages.

* cited by examiner

*Primary Examiner* — Kristina Junge
(74) *Attorney, Agent, or Firm* — Howison & Arnott, L.L.P.

(57) ABSTRACT

Disclosed is a displayed device having a top and bottom elongate rail and a display module for displaying alpha numeric information to passengers on a mass transit vehicle. The display modules may be mounted along a top and bottom edge directly to the top and bottom elongate rails. End caps are mounted to the ends of the elongate rail forming a structurally sound frame about the display module.

17 Claims, 8 Drawing Sheets

DISPLAY DEVICE FOR TRANSPORTATION VEHICLE

TECHNICAL FIELD

The present invention relates to display devices and more particularly, to programmable destination displays for use on transportation vehicles and stationary structures.

BACKGROUND

Existing mass transit vehicles, such as buses and trains, display destination and other signs for the purpose of conveying information to passengers who use the mass transit vehicles. Destination signs inform passengers who are outside or inside of the vehicle of the route information (route number and description). These signs may transmit information through a variety of display mechanisms. A destination sign may utilize light emitting diodes (LEDs), flip dot technology, or liquid crystal displays (LCDs), for example, in order to present alpha numeric information to passengers. Some destination signs may be found placed at the front of a mass transit vehicle over the windshield. Such destination signs are mounted to the existing vehicle structure via, for example, mounting brackets. Other destination signs may be found on the inside sides of the transportation vehicle as well.

Typically, conventional destination signs utilize a conventional frame assembly constructed of steel or aluminum sheet metal to house the sign and other components. The sheet metal housing is generally constructed in a rectangular box to form a front opening. The opening may be covered with a transparent material so as to enclose the entire housing while still allowing passengers to read the alpha numeric characters generated by the sign within the housing. Various components are mounted to the inside of the housing in order to prevent the components from shifting or breaking during vehicle movement and vibration. Such conventional destination signs, which are constructed of steel or aluminum sheet metal, are generally stand-alone units, which are shipped and mounted to the mass transit vehicle as a single piece.

Drawbacks of prior destination signs surface when different size signage is required. That is, for each different size sign completely different sheet metal stampings and foldings must be created to provide a frame to house the LCD, LED or flip-dot assemblies as well as the electronics associated therewith. Furthermore, fastener holes for holding metal screws must be carefully measured and aligned for each different size frame so that the fit and finish of the frame is accurate. Overall each different size destination sign frame will comprise a multitude of different parts that require detailed time consuming manufacturing assembly and welding processes even if the technology of each sign is basically the same.

What is needed is a simplified destination sign frame that requires fewer unique parts and measurements, which provides a quality destination sign structure that accommodates various destination sign sizes.

SUMMARY OF THE INVENTION

Embodiments of the invention provide a destination sign that comprises a frame having a first end cap and a second end cap as well as a top frame rail and a bottom frame rail. The top and bottom frame rails may be extruded aluminum or plastic frame rails and be interchangeable. Each extruded frame rail has a longitudinal length extending from a first end to a second end. Each extruded frame rail comprises a front surface in a first plane; an inside front surface comprising a display mounting screw slot extending the full longitudinal length of the extruded rail; a back side surface in a second plane that is parallel with the first plane. The back side surface comprises a back side screw slot extending the full length of the extruded rail; a depth surface (side surface) in a third plane that intersects the first plane at a first angle and intersects the second plane at a second angle. The depth or side surface meets the front surface at a corner edge and extends a predetermined measurement toward the back side surface; a first end cap fastener receptacle, which is adjacent to the corner, extends longitudinally from the first end to the second end of each extruded rail; and a second end cap fastener receptacle, which is adjacent to both back side surface and the depth or side surface, the second end cap fastener receptacle also extends longitudinally from the first end to the second end of each extruded rail. Within the frame is an electronic display module that is operable to produce a display, the electronic display module comprises a front side from which the display is viewable, a top edge attached to the top frame rail's display mounting screw slot and a bottom edge attached to the bottom frame rail's display mounting screw slot.

Additional embodiments further comprise a flat back panel that is attached using transversely positioned fasteners via the back side screw slot of the top frame rail and the back side screw slot of the bottom frame rail.

In some embodiments, the first end cap is attached via its first top mounting through-hole to the first end of the top frame rail at the first end cap fastener receptacle and wherein the second end cap is attached via its first top mounting through-hole to the second end of the top frame rail at the first end cap fastener receptacle.

Additionally, in some embodiments the electronic display module may comprise an LED display panel comprising rows and columns of LEDs on a front panel side. A louver panel may be attached to the front panel side of the LED display panel. The louver panel may comprise horizontal louvers positioned between each row of LEDs. Additionally the louver panel may substantially cover the LED display panel, yet provide rows and columns of openings corresponding to the rows and columns of LEDs on the front panel side. In some embodiments the louver panel may be attached to the front panel via a plurality of through-hole snap mounting features.

Embodiments of the electronic display device may have a thickness from the front side of the frame to the back side of the frame that is a minimum of 20 mm to about 40 mm. Other embodiments may have a thickness of up to about 80 mm.

In an additional embodiment of the invention, an electronic display panel is provided that comprises a top elongate rail, a bottom elongate rail and two end caps defining a rectangular frame; the top elongate rail and bottom elongate rail each defining a longitudinal direction and each having a first end and a second end. The top and bottom elongate rails each comprise a front wall and a back wall connected by a side wall, wherein the top and bottom elongate rails each comprise at least one thread receiving slot formed in and extending the entire longitudinal length of elongate rail so as to allow attachment of components to the top or bottom elongate rails at any longitudinal position using a transversely oriented fastener without further preparation of the top or bottom elongate rails. The top and bottom elongate rails may further be adapted to accept longitudinally threaded fasteners in predetermined positions at the first and second ends of the top and bottom elongate rails. The electronic display further comprises of display module having a top edge and a bottom edge. The top edge is attached to the top elongate rail's thread receiving slot with at least one transversely oriented fastener and the bottom edge is attached to the bottom elongate rail's thread receiving slot with at least one transversely oriented fastener. The at least one thread receiving slot may be on the rear of the front wall. The at least one thread receiving spot may also be on the rear of the back wall. Embodiments of the electronic display panel may further comprise a flat back panel attached to the thread receiving slot of the rear back wall of the top elongate rate as well as the rear back wall of the bottom elongate rail.

In some embodiments, the first predetermined position for accepting a longitudinally thread fastener at the top elongate rail or the bottom elongate rail is adjacent to the intersection of the front wall and the side wall. Furthermore additional embodiments may have a second predetermined position for accepting a longitudinally threaded fastener positioned adjacent to the intersection of the back wall and the side wall.

BRIEF DESCRIPTION OF THE DRAWINGS

For a more complete understanding of the method and apparatus of the present invention may be obtained by reference to the following detailed description taken in conjunction with the accompanying Drawings wherein.

DETAILED DESCRIPTION

The principles of various embodiments of the present invention provide for an electronic sign system for vehicles to be composed of self-contained display modules framed by top and bottom elongate rails and a pair of end caps. A back cover is fastened to the back walls of the top and bottom elongate rails to protect the self contained display modules from dirt and to further make the frame structure of the top and bottom elongate rails and side caps more structurally ridged. The top and bottom elongate rails are substantially identical in cross section although the bottom rail is rotated (e.g., 180° end-for-end about a transverse axis) compared to the top rail in actual use. The end caps, like the top and bottom elongate rails, are substantially identical and interchangeable. Thus embodiments of the invention provide a structurally sound display sign that can be used in a mass transit vehicle and can be manufactured with a minimal number of standardized parts. Vehicles that exemplary display signs may be mounted within include mass transit vehicles or other types of vehicles. Some examples of mass transit vehicles include buses, trains, trams, trolleys or other vehicles that display information and/or advertisements to passengers or the public on the inside or in some cases on the outside of the vehicle. The display modules may include electronic display elements, electronics, connectors and a housing or cover panel. In one embodiment the cover panel comprises a louver structure that attaches or snap fits to a display surface of an LED display panel. In lieu of the louver structure, the cover panel can incorporate another structure that allows the electronic display elements to be visible on the front side of an exemplary display sign. Some examples of alternatives can include a transparent material optionally treated to reduce glare or an aperture structure through which the display elements (e.g., LEDs) are visible. To reduce manufacturing costs, the housing components may be configured to be engaged with the LED display panel without additional fastening elements, such as screws, bolts, snaps, etc. By producing display modules that can be configured into an electronic sign along with a structural frame about the display module made of a minimum of standardized parts, shipping, installation costs, manufacturing costs and the complexity of the sign may be significantly reduced compared to conventional signs that are produced from folded sheet metal and a multitude of assembled parts with an integrated display module.

Figure 1:
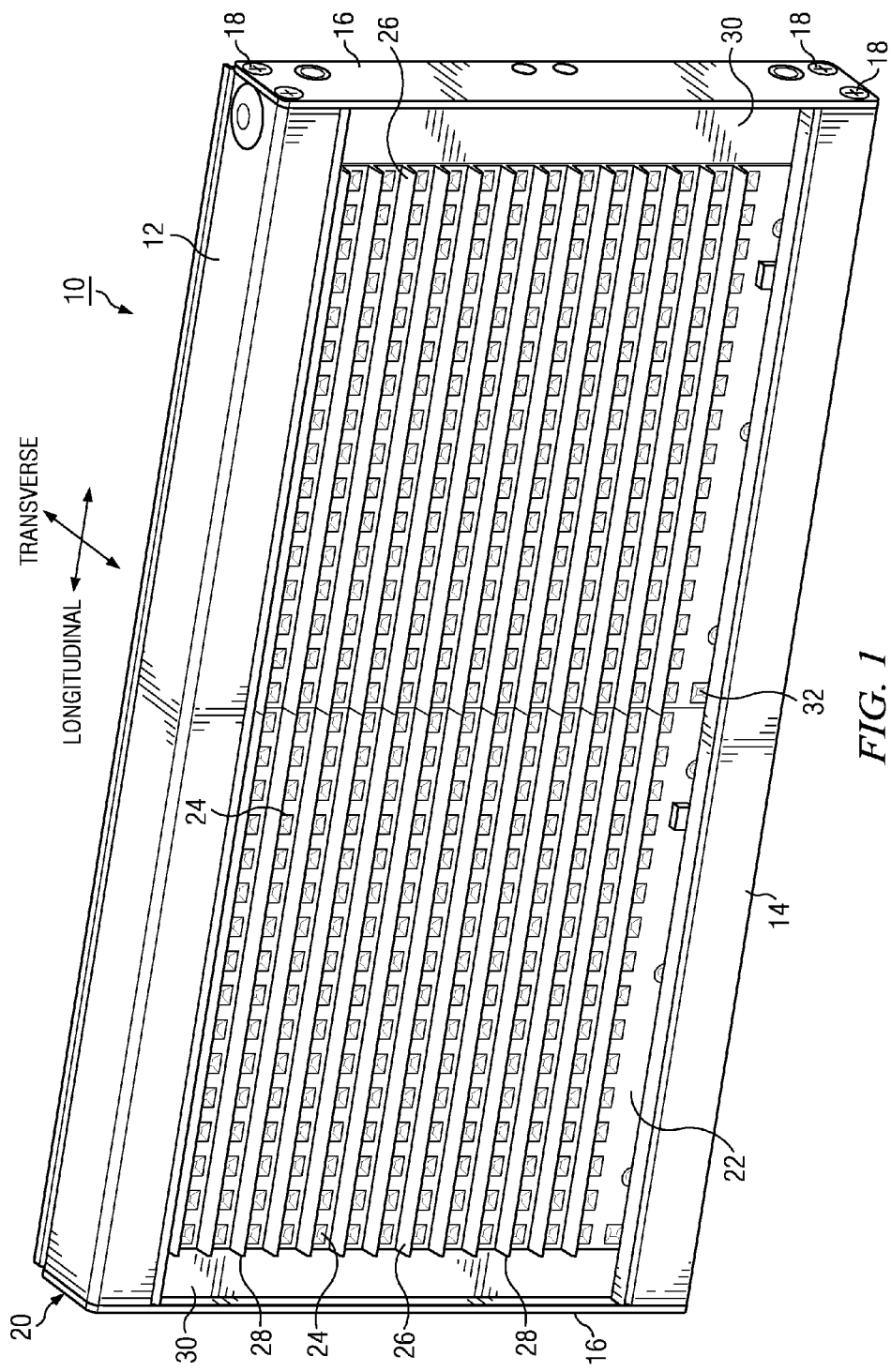
FIG. 1 is a front perspective view of an exemplary display device.

Referring now to FIG. 1, a prospective front view of an exemplary sign 10 is shown. The display sign 10 comprises a top extruded rail (elongate rail) 12 and a bottom extruded rail (elongate rail) 14. Each extruded rail 12, 14 has end caps 16 that are fastened at a top edge and a bottom edge of each end cap 16 to the top extruded rail 12 and bottom extruded rail 14, respectively, via end cap fasteners 18. The end cap fasteners 18 are placed through alignment holes on the top edge and bottom edge of each end cap 16 and screwed longitudinally into designated positions in the top extruded rail 12 and bottom extruded rail 14. The top and bottom extruded rails 12 and 14 and the end caps 16 establish a frame 20 about display module 22.

A display module 22 comprises a plurality of LEDs 24 that may be formed in a display matrix. The LEDs 24 may be white, amber, blue, yellow, green, red or a bi or tri-color combination so as to produce a wanted or needed display. In some embodiments the LEDs 24 may be surface mounted into the display module. A louver cover 26 may be placed over the LEDs. The louver cover may further comprise a plurality of louvers 28 horizontally placed on the front face of the louver cover 26. The louvers are placed between some or all the rows of LEDs 24 in order to help the LEDs be more visible in bright lighting conditions. In some embodiments, an aperture structure between each louver is provided. The aperture structure helps reduce glare and increase visual contrast by being aligned such that each of the LED display elements are visible through the apertures. The louver cover 26 may be one that is a solid piece or be comprised of multiple louver covers. FIG. 1 depicts two louver covers positioned adjacent to each other over top of the display side of a single display module 22. An optional filler plate 30 may be positioned on either side of the display module for spacing and aesthetic purposes. In some embodiments, a light sensor aperture and light sensor 32 are built into the display module so as to help the display module regulate its brightness in different lighting conditions. Furthermore, it should be noted that for aesthetic purposes and to not encourage vandalism there are no fasteners viewable on the front face or front side of an exemplary display sign 10.

Figure 2A:
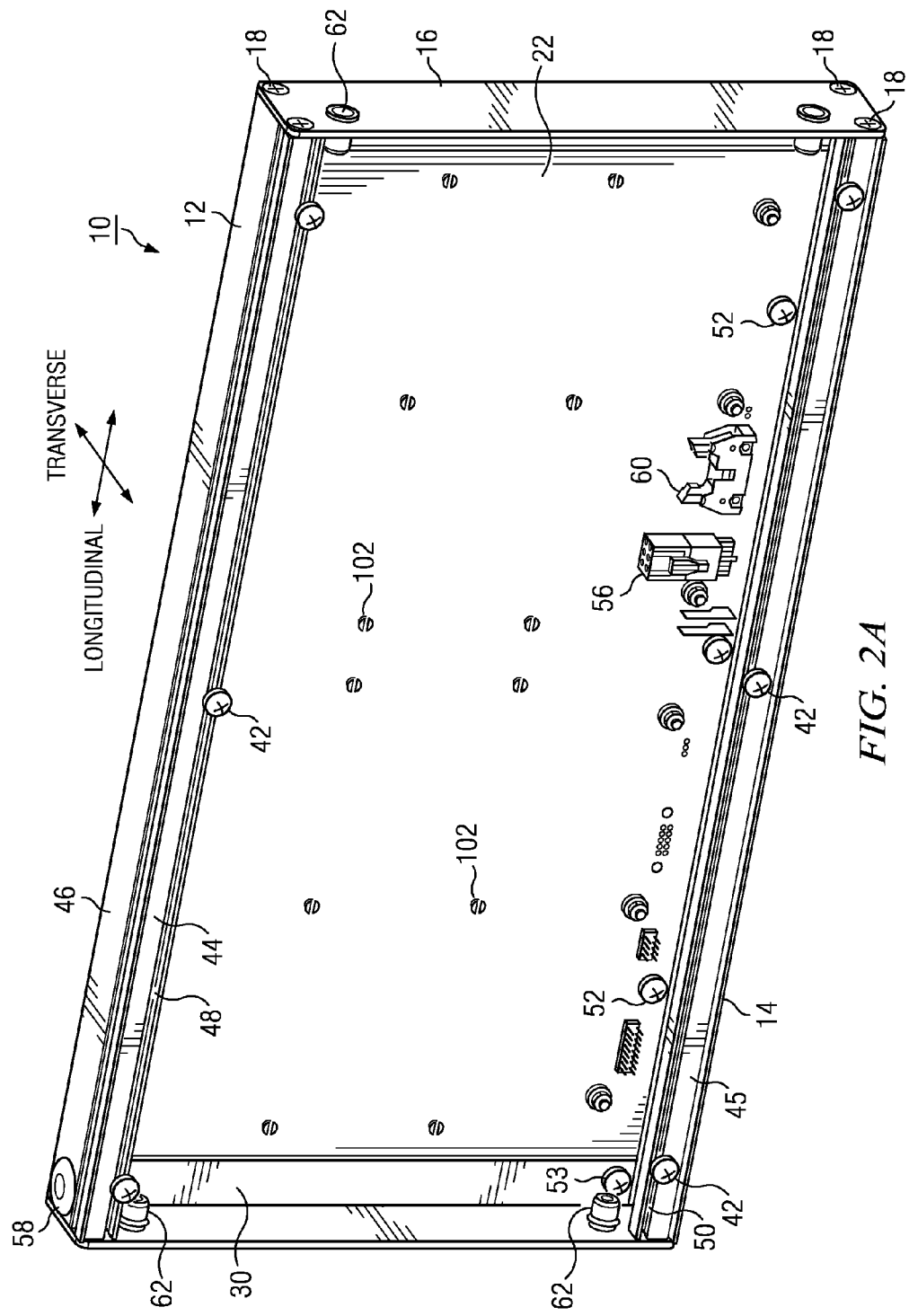
FIG. 2A is a perspective back view of an exemplary display device without a back panel.
Figure 2B:
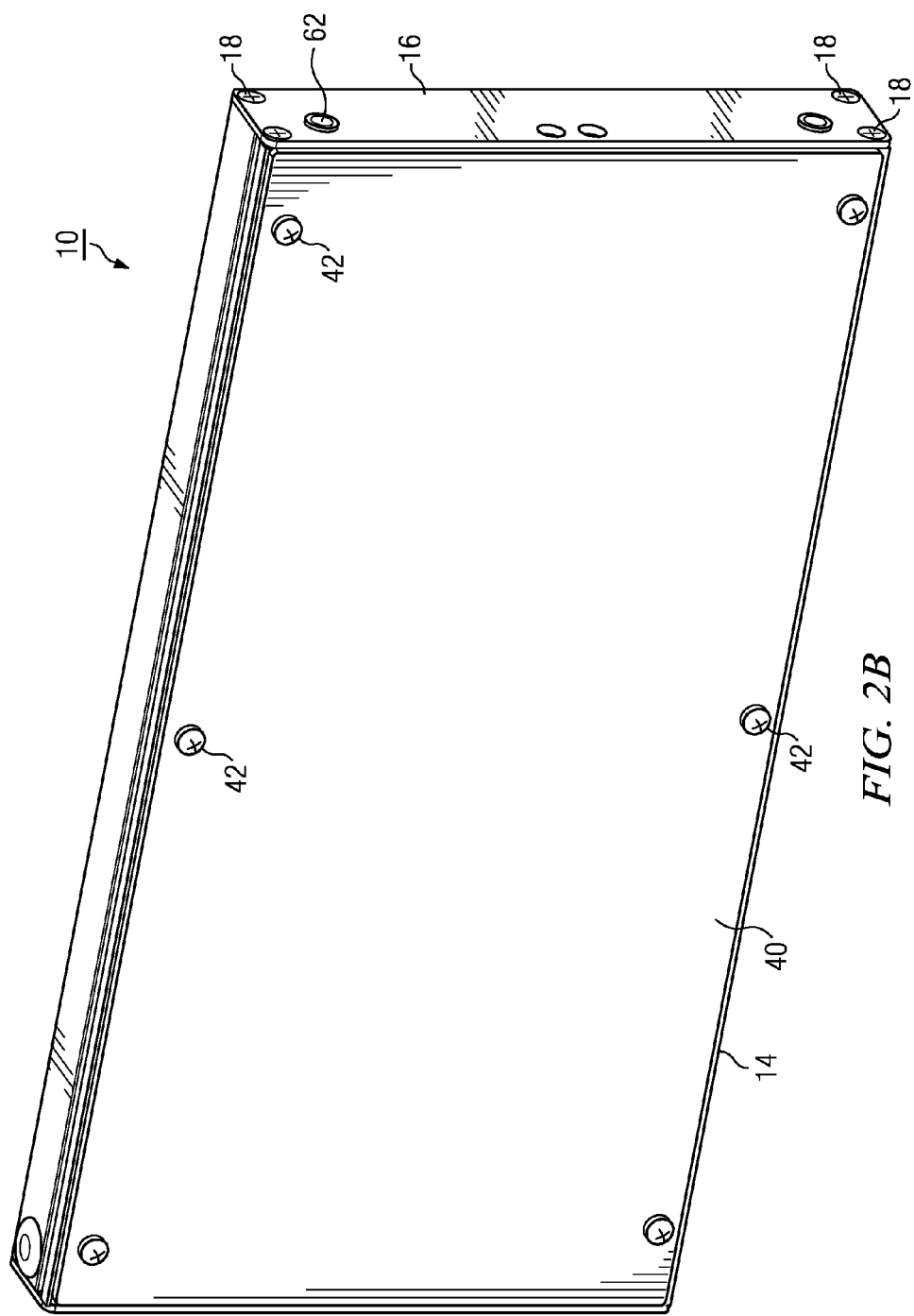
FIG. 2B is a perspective back view of an exemplary display device with a back panel.

Referring now to FIGS. 2A and 2B, a perspective view of a back side of an exemplary display sign 10 is depicted. FIG. 2A shows the exemplary display sign 10 without a back panel, while FIG. 2B depicts a display sign with the back panel or back cover 40 mounted via back cover fasteners 42. With the back panel 40 removed in FIG. 2A the back interior of an exemplary display sign 10 is easily viewed. The end cap fasteners 18 are attached such that they are screwed longitudinally into the top and bottom extruded rails 12, 14. At the top and bottom of the end caps 16 one of the end cap fasteners is attached adjacent to the back wall 44, 45 and the side wall 46 of the elongate extruded rails 12, 14.

A thread receiving slot 48 extends longitudinally the full length of the back wall 44 of the top extruded rail 12. Likewise, another thread receiving slot 50 extends the full longitudinal length of the back wall 45 of the bottom extruded rail 14. The back cover fasteners 42 can be screwed transversely into any longitudinal position of the back wall thread receiving slots 48 or 50. Thus, no additional preparation, such as creating pilot holes, measuring or aligning screw holes are necessary when attaching the back panel 40 to the display sign 10 via back cover fasteners 42 when using the exemplary back wall threaded receiving slots 44, 45 of the top and bottom extruded rails 12, 14, respectively. The longitudinal thread receiving slots 48 and 50 enable cutting an extruded aluminum elongate rail to the proper length without requiring additional preparation or alignment for the back cover fastener locations thereon. This greatly simplifies the manufacturing process and requires less manufacturing time without sacrificing resulting quality of an exemplary display sign 10.

The back side of the display module 22 can be seen centered between the optional filler plates 30 and positioned inside the exemplary display sign 10 such that it abuts the back side of the front wall of each of the top and bottom extruded rails 12, 14. Display module fasteners 52 and filler plate fasteners 53 extend through the bottom edge of the display module 22 (as well as the top edge not specifically shown) to attach the display module 22 and the filler plate 30 to the back side of the front wall of the top and bottom extruded rails 12, 14. Display module fasteners 52 and filler plate fasteners 53 are each transversely installed from the back side of an exemplary display sign 10 into the back side of the front wall, which will be described in more detail below.

An I/O power connector 56 is located on the back side of the display module 22. A power/data cable (not specifically shown) may connect to the I/O power connector 56 and exit the exemplary display sign 10 via the cutaway and grommet 58, which is adapted to allow cable management in and out of an exemplary display sign 10 while protecting wiring therethrough from a vibrational wear. A data connector 60 may be used to connect multiple display modules within a same exemplary display sign to each other. In some embodiments, one display module may be a master display module, while additional display modules in an exemplary display sign are slave modules that follow instructions provided from the master display module.

Additionally in some embodiments the mounting fixture 62 or multiple mounting fixtures 62 may be incorporated into the end caps 16 so that embodiments of the invention may be hung or mounted to an external mounting apparatus that allows the sign to tilt or controls the viewing angle of the sign when mounted within a mass transportation vehicle.

Figure 3:
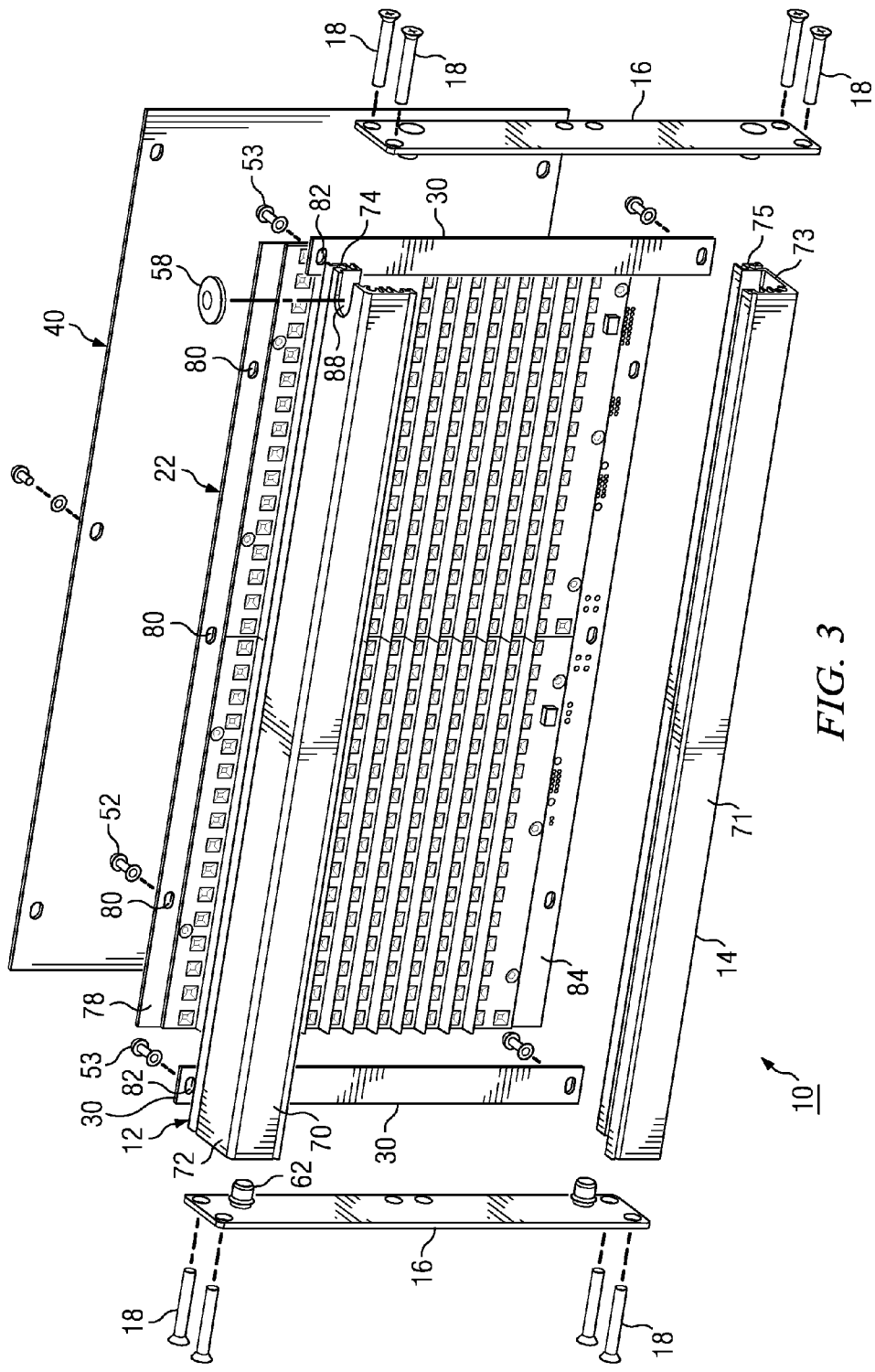
FIG. 3 is a front exploded view of an exemplary display device.

Referring now to FIG. 3 an exploded perspective view of an exemplary display sign 10 is depicted. The top elongate rail 12 and bottom elongate rail 14 are substantially the same but rotated 180 degrees end-to-end about a transverse axis with respect to each other. Each elongate rail 12, 14 has a front wall 70, 71 a side wall 72, 73 and a back wall 74, 75. The top edge 78 of the display module 22 has spaced through-holes 80 thereon. Transverse fasteners 52 fasten the top edge 78 of the display module to the back side of the front wall 70 via the through-holes 80. Transverse fasteners 53 fasten the top edge of each filler plate 30 to the back side of the front wall 70 via filler plate through-holes 82. In a similar fashion, the bottom edge 84 of the display module 22 and the bottom edges of the filler plates 30 are fastened to the back side of the front wall 71 of the bottom extruded rail 14. It should be understood that on the back side of the front wall 70, 71 of the extruded rails 12, 14 another thread receiving slot (not specifically shown in this figure) extends longitudinally from one end to the other on the extruded rail. Thus, when the top and bottom extruded rails 12, 14 are cut for manufacturing; it doesn't matter where the cut is made because the longitudinal thread receiving slot allows the transverse fasteners to be positioned at any longitudinal position of the thread receiving slot. No alignment with through-holes is necessary and assembly is simplified.

Each extruded rail 12, 14 has additional longitudinal thread receiving slots that are adapted to receive fasteners in a longitudinal direction. These longitudinal thread receiving slots allow end cap fasteners 18 to be screwed into the end surfaces of an exemplary extruded rail 12, 14. As shown end cap fasteners 18 are fastened to an end of an exemplary extruded rail 12, 14 with one fastener being screwed longitudinally into an end of the extruded rail's back wall and another end cap fastener may be screwed into a longitudinal thread receiving slots in an area adjacent to the front wall 70, 71 and side wall 72, 73 at the end of an exemplary extruded rails 12, 14, respectively.

In some embodiments, the top extruded rail 12 and bottom extruded rail may be a bit different due to a cutaway portion 88 in the side wall of one of the extruded rails, wherein a grommet may be placed and communication and power cabling may be routed from the transit vehicle into an exemplary display sign 10.

Figure 4:
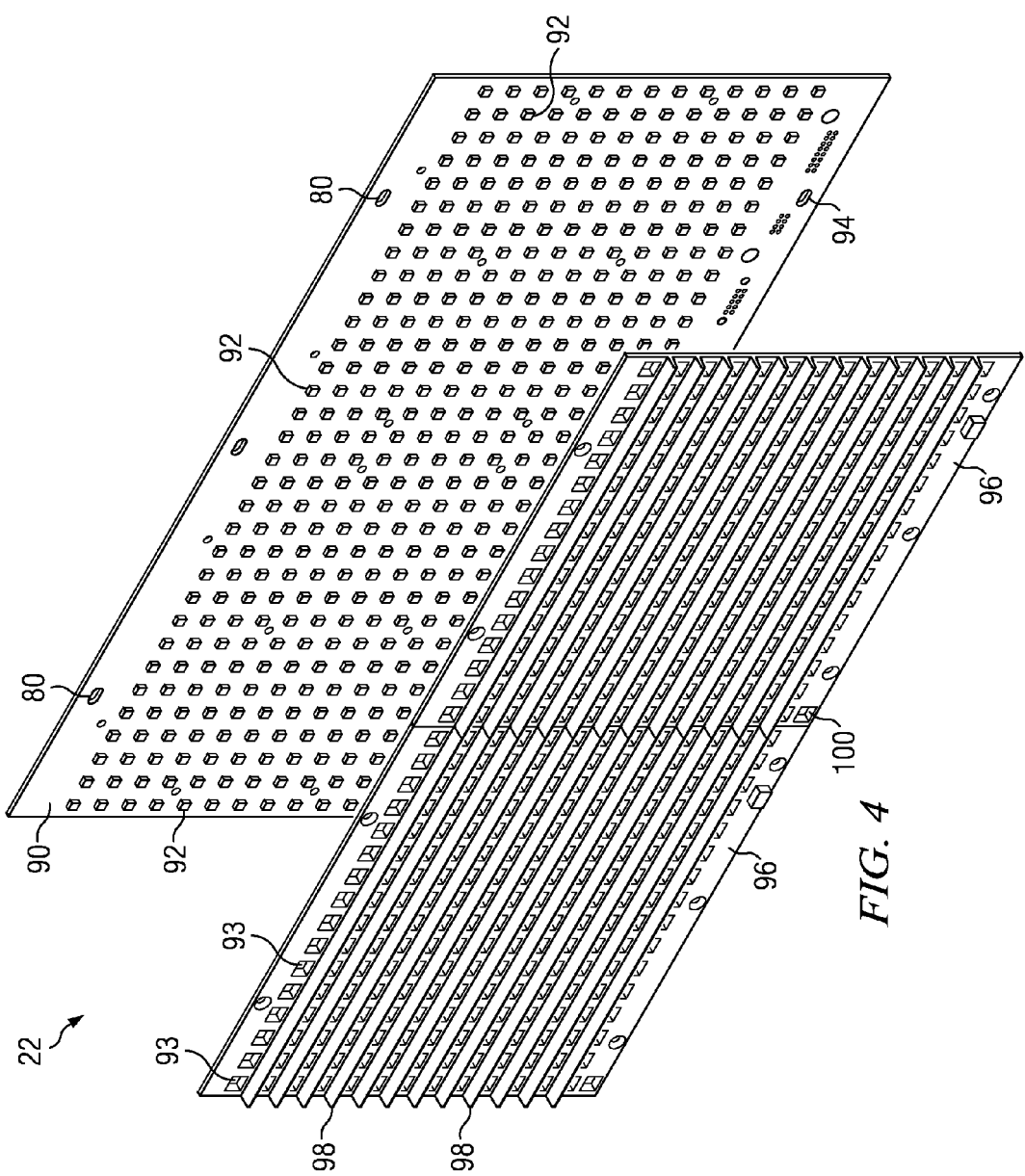
FIG. 4 is a perspective exploded view of an exemplary display module.

Referring now to FIG. 4 an exploded perspective view of an exemplary display module 22 is depicted. Here the LED display panel 90 comprises a matrix of LEDs 92 that are adapted to display destination information or advertising per the needs of the transportation vehicle in which the exemplary sign is installed. The LEDs 92 may be surface mount LEDs of varying colors and variety. The pitch or distance between each LED 92 may range from about 5 mm to about 20 mm depending on the resolution requirements of the graphics or fonts to be displayed. Necessary electronics may also be mounted on the back side of the LED display panel 90. A plurality of top mounting holes 80 are positioned adjacent to the top edge of the LED display 90 while a second plurality of bottom mounting holes 94 are positioned along or adjacent to the bottom edge of the exemplary LED display 90. The top and bottom mounting holes are for attaching the overall display module 22 to the back side of the front wall of the top and bottom elongate rails 12, 14. Pressed against the front surface of the LED display 90 are one or more louver panels 96. The louver panels may be made of plastic, lexan, PBT plastic or another hard plastic polymer. Horizontal louvers are placed between some or all of the rows of LEDs 92, and apertures 93 are positioned such that the display elements or LEDs 92 are visible therethrough. The apertures may have tapered openings to further deter the effects of glare or unwanted external lighting and to set the maximum available viewing angle of the display panel. Exemplary display panels may have a viewing angle ranging from about 170 degrees to about 100 degrees horizontally. The vertical viewing angle of the display angle may be somewhat less due to the louvers 98 that extend out from the louver panel's 96 surface. The aperture structure further provides a black background about each LED 92 that may be a buff or a glossy surface to further maximize the contrast between the LEDs 92 of the display module 22 and the front surface of the louver panel 96. A light sensor aperture 100 is located on the louver panel 96 to coincide with a light sensor on the front surface of the LED display 90. The light sensor is used to adjust the brightness of the overall display module 22 depending on the ambient lighting conditions.

On louver panel 96, an LED display 90 may be configured to be engaged without additional fastening elements such as screws or bolts. In particular, as can be seen in FIGS. 2A and 5 a snap mount feature 102 may extend from the back side of the louver panel 96 through the LED display panel 90 to hold the louver panel 96 in place and against the front side of the LED display panel 90.

Figure 5:
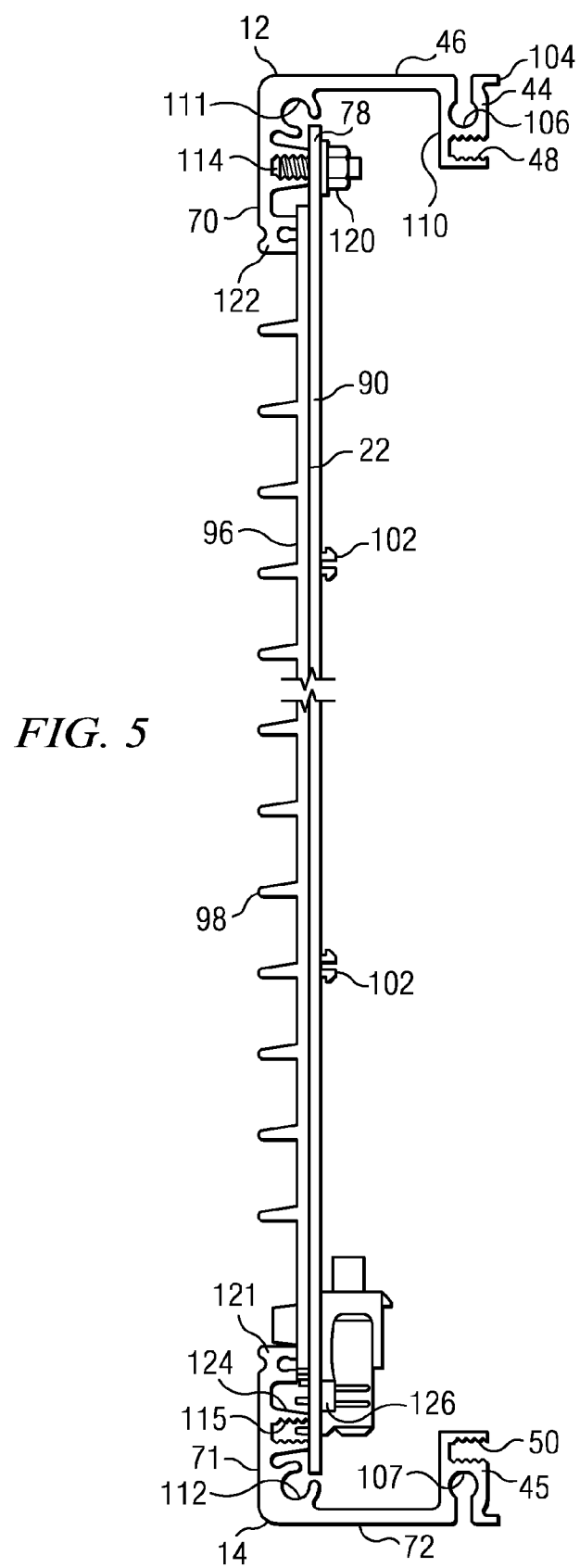
FIG. 5 is side cut-away view of an exemplary display device without a back panel attached.

Referring now to FIG. 5, where a side cutaway view of an exemplary display sign is shown. The exemplary display sign has a top extruded rail 12 and a bottom extruded rail 14. The extruded rails 12, 14 may be made of aluminum, plastic, or a variety of polymers that may be manufactured via an extrusion process. The top extruded rail 12 has a cross section that is identical to the bottom extruded rail's cross section, but when an exemplary display sign is manufactured the top and bottom rails are rotated 180 degrees end-for-end with respect to each other about a transverse axis. Focusing on the top portion of the figure, the extruded rail 12 has a front wall 70 in a first plane, a back wall 44 in a second plane that may be parallel with the first plane of the front wall 70, and a sidewall 46 that connects the front wall 70 to the back wall 44. The sidewall 46 is in a plane that intersects the front wall 70 plane and the back wall 44 plane. The side wall 46 is shown to be in a plane that is substantially perpendicular to the front wall 70 and the back wall 44, but in alternative embodiments the side wall 46 may not intersect the front wall 70 or rear wall 44 planes at 90 degree angles. For example the side wall 46 may flare outwardly establishing an obtuse angular relationship with the front wall 70 and a less than 90 degree angular relationship with the back wall 44.

The back wall 44 of a top elongate rail 12 comprises a back wall thread receiving slot 48, which extends the full longitudinal length of an exemplary extruded rail. The back wall thread receiving slot 48 is adapted to allow a transverse fastener to be screwed into the thread receiving slot 48 at any longitudinal position on the elongate rail without further preparation of the extruded rail 12. In various embodiments of the invention, a back cover or panel 40 may be attached or affixed to the back wall 44 via a back cover fastener 42 (see FIG. 2A) engaged through the back cover or panel and into the back wall thread receiving slot 48 at substantially any longitudinal position necessary. The back wall 44 may also have a lip 104 extending at the edge of the back wall where it meets the side wall 46. The lip 104 may be used to help align and/or cover the edge of the back cover or panel 40 where it is installed or attached against the back wall 44. Also in the back wall 44 is a back wall longitudinal thread receiving slot 106, which extends the full longitudinal length of an exemplary extruded rail. The back wall longitudinal thread receiving slot 106 is adapted to allow an end cap fastener 18 (see FIG. 3) to be installed longitudinally into both ends of the extruded rail 12. The end cap fastener 18 is used to attach the end cap 16 to the sides or ends of the top and bottom extruded rails 12, 14. The back wall 44 is spaced from the front wall 70 by a predetermined distance, which is established by the width of the side wall 46. In various embodiments of the invention the distance between the front side of the front wall 70 and the back side of the back wall 44 is between about 20 to about 40 mm. Thus, the distance between the back side of the front wall 70 and the front side of the back wall 44 may be from about 5 mm to about 30 mm or more. In some embodiments, the back side of the back wall 44 may be further than 40 mm from the front side of the front wall to allow for greater amount of room within the C-shaped cavity 110 created by the interior sides of the front wall 70, side wall 46 and back wall 44. The interior C-shaped cavity 110 provides room for interior fasteners and electronics.

Adjacent to where the sidewall 46 intersects with the front wall 70 is a front wall longitudinal thread receiving slot 111, which like the back longitudinal receiving slot 106 is adapted to allow an end cap fastener 18 to be screwed into the front wall longitudinal thread receiving slot 111 and thereby secure an end cap 16 to the end surface of the top extruded rail 12. The front wall longitudinal thread receiving slot 111 extends longitudinally the full length of the extruded rail.

The front wall 70 of the top extruded rail 12 defines a front edging about the top edge of the display module 22. On the back side of the front wall 70 is a front wall thread receiving slot 114, which like the back wall thread receiving slot 48, extends the full longitudinal length of the extruded rail so as to allow attachment of components to the back side of the front wall 70 at any longitudinal position using a transversely oriented fastener without further preparation of the extruded rail. A transverse fastener 120 is shown fastening the top edge 78 of the display module 22 to the back side of the front wall 70 using the front wall thread receiving slot 114. When attached to the back side of the front wall, a top portion of the front side of the display module 22 is abutted against an abutment member 122 such that continuous linear contact and pressure is applied to the front side edge of the display module 22 while the fastener 120 is holding the top edge 78 of the display module against the back side of the front wall 70. The abutment member 122 also extends the full longitudinal length of the extruded rail 12 such that it abuts the front side of the display module 22 over the entire longitudinal edge length of the display module. In particular, the abutment member 122 also may be used to press the top edge of the louver panel 96 against the front surface of the LED display panel 90 in order to help eliminate any spacing or potential rattling between the louver 96 and the LED display panel 90. The display module 22 may be a variety of heights as it extends between the top extruded rail 12 and the bottom extruded rail 14. The display module may have some connectors or electronics 126 that extend through through-holes through the display module 22 and protrude on both sides (front and back of the display module 22). Looking now at the bottom extruded rail 14, which is substantially identical, but rotated 180 degrees end-for-end about a transverse axis with respect to the top rail 12, one can see that there is a longitudinal trough 124 that extends the full longitudinal length of an exemplary extruded rail. The longitudinal trough 124 provides a vacant area so that through-hole contacts from the electronics or connectors 126 mounted on the back or front side edges of the display module 22 can be positioned within the longitudinal trough 124 such that they do not short out or touch the conductive surface of an aluminum extruded rail 14. Like the top extruded rail 12, the bottom extruded rail 14 has an abutment member 121, a thread receiving slot 115 on the back side of the front wall 71, a front wall longitudinal thread receiving slot 112, a side wall 72 and a back wall thread receiving slot 107 located adjacent to both the back wall 45 and the side wall 72. Furthermore, in the back wall 45 is a back wall thread receiving slot 50 that mirrors the back wall thread receiving slot 48 of the top extruded rail 12.

Figure 6:
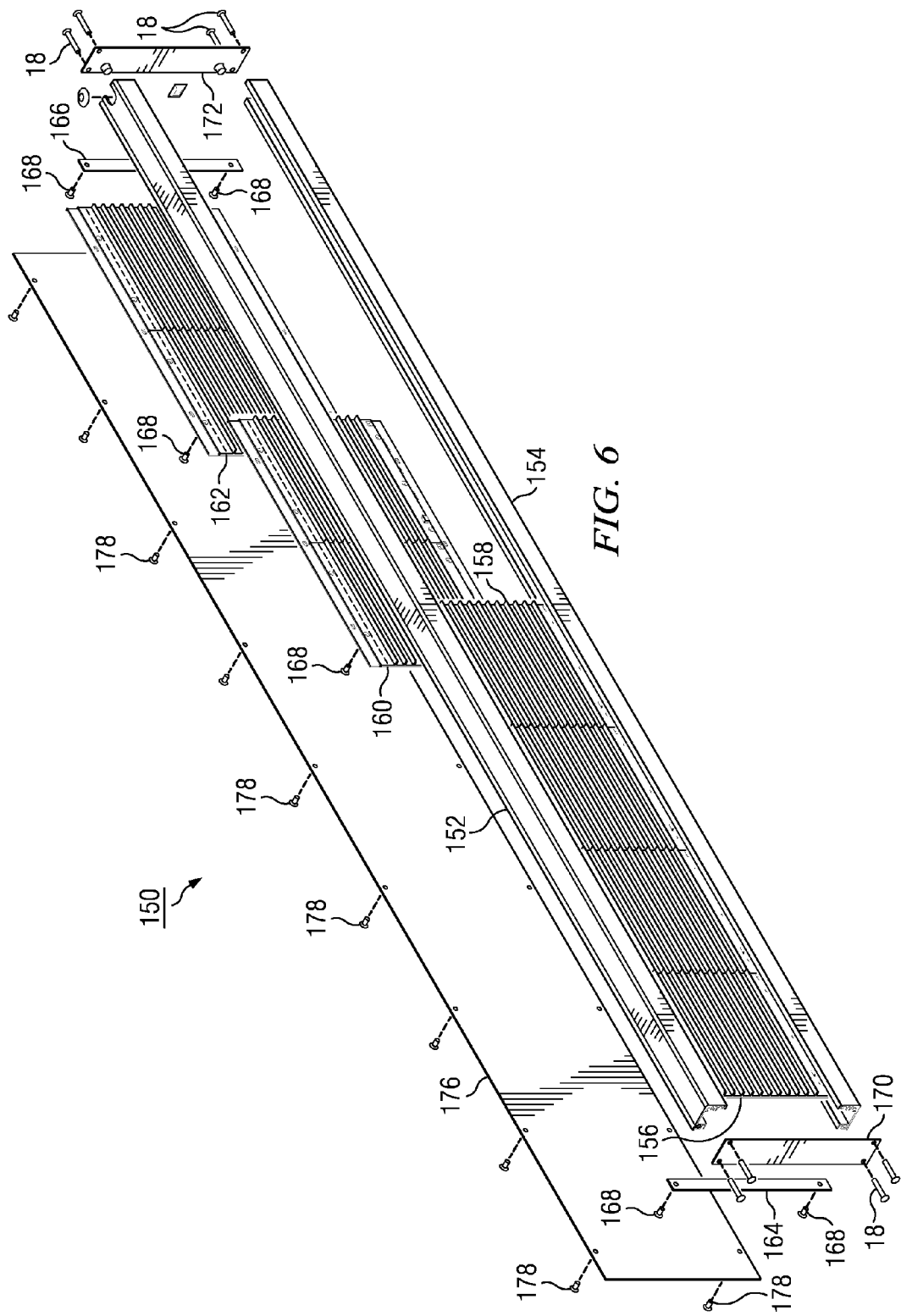
FIG. 6 is a front exploded view of another exemplary embodiment of the invention.

Referring now to FIG. 6 an exploded perspective view of another exemplary display sign 150 is depicted. Here the display sign 150 shows how the top extruded rail 152 and bottom extruded rail 154 can both be made longer in order to hold a plurality of display modules 156, 158, 160, 162 thereby establishing a larger and longer display sign. As discussed, with respect to FIG. 2A, here one of the display modules, for example 156 may be a master module and the remaining display modules 158, 160 and 162 may be slave modules connected to each other via a data connector 60 (See, FIG.

2A) found on the back side of each of the display modules such that the multiple display modules operate in unison. The display modules 156, 158, 160 and 162 are mounted with transverse fasteners 168 against the back side of the front walls of the top and bottom extruded rails 152, 154 using the thread receiving slots that extend longitudinally along the back side of the front walls of the extruded rails. Filler plates 164, 166 may also be mounted to the thread receiving slots on the back side of the front walls of the extruded rails using transverse fasteners 168. End caps 170 and 172 are attached to the first and second ends of both the top and bottom extruded rails 152, 154 using a longitudinal end cap fastener 18 that longitudinally mount on the front wall and back wall longitudinal thread receiving slots of each of the two extruded rails 152, 154.

A back panel 176 is mounted to the back side of the back wall of both the top and bottom extruded rails 152, 154 using transverse fasteners 178 and the back wall thread receiving slot that extends longitudinally the full length of both the top and bottom extruded rails 152, 154.

Various size display signs can be manufactured having varying heights (based on display module height) and widths (depending on the number of display modules to be mounted within an exemplary display sign). The top extruded rail and bottom extruded rail, being identical and having thread receiving slots adapted to receive transverse fasteners allows the extruded rails to be cut to their desired length without a need for further preparation of the rails for receiving transverse fasteners to attach, for example, the display modules or the back panel thereto. The end caps are also interchangeably identical, thus standardization and mass production of various sized display signs can be performed with minimal extra cost or retooling. Manufacturing requires only a single inventory of the extruded rails that can be cut to selected lengths, end caps, display modules and standardized wiring harnesses as well as a back panel or cover and perhaps optional filler plates. End cap fasteners and transverse fasteners are used to assemble the parts without any welding, gluing or other manufacturing requirements. The result is a very sturdy, stable, cost effective, light weight and thin display sign that can be installed in a mass transit vehicle or used as signage elsewhere.

Figure 7:
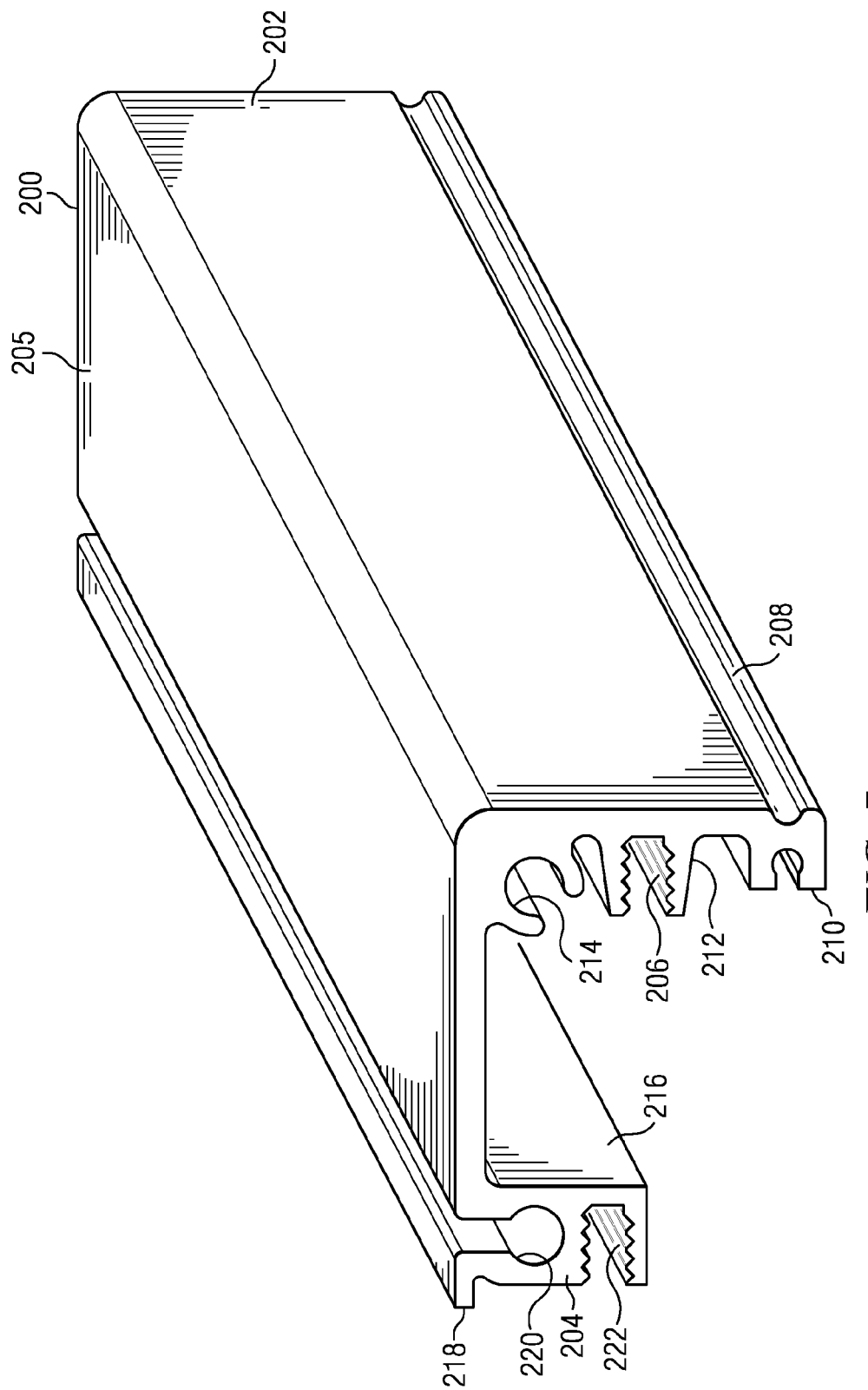
FIG. 7 is a perspective view of a top or bottom extruded rail.

Referring to FIG. 7, a perspective view of an exemplary extruded rail 200 is provided. The exemplary extruded rail 200 has a front wall 202 in a first plane that is substantially parallel with a back wall 204 in a second plane. The side wall 205 connects the front wall 202 to the back 204 in a third plane that intersects the first plane of the front wall 202 at a first angle and the second plane of the back wall 204 at a second angle. The side wall meets the front wall at a corner edge and extends a predetermined measurement or distance toward the back wall 204. In some embodiments the predetermined distance may be from 20 to about 40 mm. In additional embodiments that predetermined distance may be more than 40 mm and up to about 80 mm. On the back side of the front wall 202 is a front wall transverse thread receiving slot 206 that extends the full longitudinal length of the exemplary extruded rail 200. On the back side of the front edge 208 of the front wall 202 is an abutment portion 210 that protrudes from the back side of the front wall and extends the full longitudinal length of the exemplary extruded rail 200. A trough 212 is formed on the back side of the front wall and also extends the full longitudinal length of the extruded rail 200. In addition, a front wall longitudinal thread receiving slot 214 is positioned in the front wall 202 and extends the longitudinal length of the extruded rail 200. In some embodiments the front wall longitudinal thread receiving slot 214 is positioned adjacent to both the front wall 202 and the side wall 204. An interior cavity 216 is formed in somewhat of a C-shape from the front wall 202, side wall 205 and back wall 204. The side wall 205 extends toward the back wall and establishes a lip 218, which extends or protrudes beyond the back side of the back wall 204. The lip extends the full longitudinal length of the extruded rail 200. Within the back wall is a longitudinal thread receiving slot 220, which, like the front wall longitudinal thread receiving slot 214, is adapted to receive a threaded fastener longitudinally at either end of the extruded rail 200. Furthermore, on the back side of the back wall 204 a back wall transverse thread receiving slot 222 extends the full longitudinal length of the extruded rail 200. The back wall transverse thread receiving slot 222, as well as the front wall transverse thread receiving slot 206, allow threaded attachment of components to the rail at any longitudinal position along the selected transverse thread receiving slot using transversely oriented fasteners and without further or additional preparation of the extruded rail 200. Furthermore, longitudinal fasteners can be attached to either end of an exemplary extruded rail 200 in either of the front wall or back wall longitudinal thread receiving slots 214, 220.

Although various embodiments of the apparatus of the present invention have been illustrated in the accompanied drawings and described in the foregoing detailed description, it will be understood that the invention is not limited to the embodiments disclosed, but is capable of additional rearrangements, modifications, and substitutions without departing from the understanding of the invention as set forth and defined by the following claims. Accordingly, it should be understood that the scope of the present invention encompasses all such arrangements and is solely limited by the claims as follows:

What is claimed is:

1. An electronic display device comprising:
   a first display module operable to produce a display, the first display module comprises a front side from which the display is viewable, a top edge and a bottom edge; and
   a frame about the display module, the frame comprising:
   a first end cap and a second end cap;
   a top frame rail having a longitudinal length extending from a first end to second end, the top frame rail comprising:
   a front wall in a first plane, the front wall comprises a first transverse thread receiving slot on backside of the front wall, the first transverse thread receiving slot extends the full longitudinal length of the top rail;
   a back wall in a second plane that is substantially parallel with the first plane, the back wall comprising a second transverse thread receiving slot on the backside of the back wall, the second transverse thread receiving slot extend the full length of the top rail;
   a side wall in a third plane that intersects the first plane at a first angle and intersects the second plane at a second angle, the side wall meets the front surface at a corner edge and extends a predetermined measurement toward the back wall;
   a first longitudinal receptacle adjacent to the corner edge, the first longitudinal receptacle extends longitudinally from the first end to the second end and is accessible from both the first end and the second end of the top rail; and
   a second longitudinal receptacle in the back wall, the second longitudinal receptacle extends longitudinally from the first end to the second end and is accessible from both the first end and the second end of the top rail; and a bottom frame rail having a first end and a second end, the bottom frame rail being substantially the same as the top frame rail, but is rotated about a transverse axis 180 degrees;

wherein the first and second end caps are mounted to the first ends and second ends of the top and bottom frame rails, respectively, with longitudinal fasteners, the longitudinal fasteners being engaged with the first and second longitudinal receptacles at the first and second ends of the top and bottom frame rails; and wherein the top edge of the first display module is attached to the first transverse thread receiving slot of the top frame rail with a first plurality of transverse fasteners; and wherein the bottom edge of the first display module is attached to the first transverse thread receiving slot of the bottom frame rail with a second plurality of transverse fasteners.

2. The electronic display device of claim 1, wherein the top frame rail and the bottom frame rail are made from an extruded metal or metal alloy.

3. The electronic display device of claim 1, further comprising a back panel attached to the second transverse thread receiving slot on the backside of the back walls of the top and bottom frame rails with a plurality of transverse fasteners.

4. The electronic display device of claim 1, wherein the first display module comprises an LED display panel comprising a plurality of LEDs positioned in rows and columns on a front side of the LED display panel; and a cover panel over the front side of the LED panel adapted to enhance the visibility of the display.

5. The electronic display device of claim 4, wherein the cover panel comprises a plurality of horizontal louvers.

6. The electronic display device of claim 4, wherein the cover panel is attached to the LED display panel with at least one snap mounting feature.

7. The electronic display device of claim 4, wherein the cover panel comprises an aperture structure adapted to allow the rows and columns of LEDs to be viewed therethrough.

8. The electronic display device of claim 1 further comprising a second display module comprising a front side from which the display is viewable, a top edge and a bottom edge;

wherein the top edge of the second display module is attached to the first transverse thread receiving slot of the top frame rail with transverse fasteners; and wherein the bottom edge of the second display module is attached to the first transverse thread receiving slot of the bottom frame rail with transverse fasteners.

9. The electronic display device of claim 8, wherein the first display module operates as a master display module and the second display module operates as a slave display module.

10. The electronic display panel of claim 8, wherein the first and the second end caps are interchangeable end caps such that a first interchangeable end cap is attached at the first end of the top elongate rail with longitudinal fasteners engaged with the first longitudinal receptacle and the second longitudinal receptacle; and a second interchangeable end cap is attached to the second end of the top elongate rail with longitudinal fasteners engaged with the first longitudinal receptacle and the second longitudinal receptacle.

11. The electronic display panel of claim 10, wherein a predetermined same position on the first ends and second ends of the top and the bottom elongate rails is adjacent to the intersection of the front wall and the side wall.

12. An electronic display panel comprising:

a top elongate rail having a length extending from a first end to a second end, the top elongate rail comprising:

a front wall in a first plane, the front wall comprises a first transverse thread receiving slot on backside of the front wall, the first transverse thread receiving slot extends the full longitudinal length of the top rail;

a back wall in a second plane that is substantially parallel with the first plane, the back wall comprising a second transverse thread receiving slot on the backside of the back wall, the second transverse thread receiving slot extends the full length of the top rail;

a side wall in a third plane that intersects the first plane at a first angle and intersects the second plane at a second angle, the side wall meets the front surface at a corner edge and separates the front wall from the back wall by a predetermined distance;

a first longitudinal receptacle adjacent to the corner edge, the first longitudinal receptacle extends longitudinally from the first end to the second end and is accessible from both the first end and the second end of the top rail; and a second longitudinal receptacle in the back wall, the second longitudinal receptacle extends longitudinally from the first end to the second end and is accessible from both the first end and the second end of the top rail;

a first display module operable to produce a display, the electronic display module comprising a front side from which the display is viewable, a top edge attached to the first transverse thread receiving slot with at least one transverse fastener, and a bottom edge; and a back panel attached to the second transverse thread receiving slot on the backside of the back wall of the top elongate rail with at least one transverse fastener.

13. The electronic display panel of claim 12, further comprising:

a bottom elongate rail being substantially the same as the top elongate rail, the bottom edge of the first display module being attached to a first transverse thread receiving slot of the bottom elongate rail with at least one transverse fastener.

14. The electronic display panel of claim 13, wherein at least one of the top elongate rail and the bottom elongate rail further comprises a cut away portion on the side wall, the cut away portion being adapted to enable electrical cabling into the electronic display panel.

15. The electronic display panel of claim 12, wherein the first display module comprises:

an LED display panel comprising rows and columns of LEDs on a front side of the LED display panel; and a louver panel positioned against the front side of the LED display panel, the louver panel comprising horizontal louvers positioned between each row of LEDs, the top edge of the louver panel being in contact with a backside portion of the front wall.

16. An electronic display panel comprising:

a top elongate rail, a bottom elongate rail and two end caps defining a rectangular frame; the top and bottom elongate rails each having parallel longitudinal axis and each having a first end and a second end; the top and bottom elongate rails each comprise a front wall and a back wall connected by a side wall, wherein the top and bottom elongate rails each comprise a first transverse thread receiving slot formed in and extending the longitudinal length of the top and bottom elongate rails so as to allow attachment of components to the top or bottom elongate rails at any longitudinal position using a transversely oriented fastener without further preparation of the top or bottom elongate rails, the top and bottom elongate rails further adapted to accept a longitudinally threaded fastener in a predetermined same position on the first end and second ends of the top and bottom elongate rails; and a display module having a top edge and a bottom edge, the top edge being attached to the top elongate rail's first transverse thread receiving slot with at least one transversely oriented fastener and the bottom edge being attached to the bottom elongate rail's first transverse thread receiving slot with at least one transversely oriented fastener;

a second transverse thread receiving slot formed in and extending the longitudinal length of the top and the bottom elongate rails; and a back panel attached to the second transverse thread receiving slot thread receiving slots on the top and the bottom elongate rails.

17. The electronic display panel of claim 16, wherein the first transverse thread receiving slot is on the back side of the front wall.

* * * * *